(12) United States Patent
Ebihara et al.

(10) Patent No.: US 10,498,999 B2
(45) Date of Patent: Dec. 3, 2019

(54) COMPARATOR FOR DOUBLE RAMP ANALOG TO DIGITAL CONVERTER

(71) Applicant: OmniVision Technologies, Inc., Santa Clara, CA (US)

(72) Inventors: Hiroaki Ebihara, Santa Clara, CA (US); Zheng Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/035,388

(22) Filed: Jul. 13, 2018

(65) Prior Publication Data
US 2018/0324379 A1    Nov. 8, 2018

Related U.S. Application Data

(62) Division of application No. 15/277,648, filed on Sep. 27, 2016, now Pat. No. 10,079,990.

(51) Int. Cl.
*H04N 5/378* (2011.01)
*H03K 5/24* (2006.01)

(52) U.S. Cl.
CPC ........... *H04N 5/378* (2013.01); *H03K 5/2481* (2013.01)

(58) Field of Classification Search
CPC .............................. H04N 5/378; H03K 5/2481
See application file for complete search history.

(56) References Cited

U.S. PATENT DOCUMENTS

| | | | |
|---|---|---|---|
| 8,730,364 B2 | 5/2014 | Dai et al. | |
| 9,055,250 B2 | 6/2015 | Park et al. | |
| 9,774,811 B1 | 9/2017 | Ebihara et al. | |
| 2005/0024245 A1 | 2/2005 | Sit et al. | |
| 2010/0002120 A1* | 1/2010 | Yoshikawa | H04N 5/3575 348/312 |
| 2014/0070974 A1* | 3/2014 | Park | H04N 5/3742 341/155 |
| 2014/0266309 A1 | 9/2014 | Jakobson | |
| 2015/0172580 A1* | 6/2015 | Zhang | H04N 5/378 250/208.1 |
| 2015/0237274 A1 | 8/2015 | Yang et al. | |

OTHER PUBLICATIONS

ROC (Taiwan) Patent Application No. 106132874—Office Action and English Translation, dated Jun. 29, 2018, 7 pages.
Figueiredo et al., "Kickback Noise Reduction Techniques for CMOS Latched Comparators," IEEE Express Briefs, col. 53, No. 7, pp. 541-545, Jul. 2006.

* cited by examiner

*Primary Examiner* — Gevell V Selby
(74) *Attorney, Agent, or Firm* — Christensen O'Connor Johnson Kindness PLLC

(57) ABSTRACT

A comparator includes a first stage coupled to compare a reference voltage to an image charge voltage signal. The first stage includes first and second NMOS input transistors coupled between an enabling transistor and respective first and second cascode devices to receive the reference voltage and the image charge voltage signal. A first auto-zero switch is between a gate of the first NMOS input transistor and a first node. The first node is between the first NMOS input transistor and the first cascode device. A second auto-zero switch is between a gate of the second NMOS input transistor and a second node. The second node is between the second cascode device and a second PMOS transistor. A voltage difference between the first and second nodes during an auto-zero period reduces an amount of kickback that occurs during an ADC period.

13 Claims, 8 Drawing Sheets

COMPARATOR FOR DOUBLE RAMP ANALOG TO DIGITAL CONVERTER

CROSS-REFERENCE TO RELATED APPLICATION

This application is a divisional of U.S. patent application Ser. No. 15/277,648, filed on Sep. 27, 2016, now pending. U.S. patent application Ser. No. 15/277,648 is hereby incorporated by reference.

TECHNICAL FIELD

This disclosure relates generally to image sensors, and in particular but not exclusively, relates to increased analog to digital conversion range of an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. The charge may be converted into a digital representation of the charge by the image sensor based on a comparison to a reference voltage signal. The comparison may conventionally be performed by a comparator, which provides an output as the digital representation of the charge. However, noise may be injected into the output by the comparator. Additionally, the outputs of the comparator may affect to the input and cause some errors.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
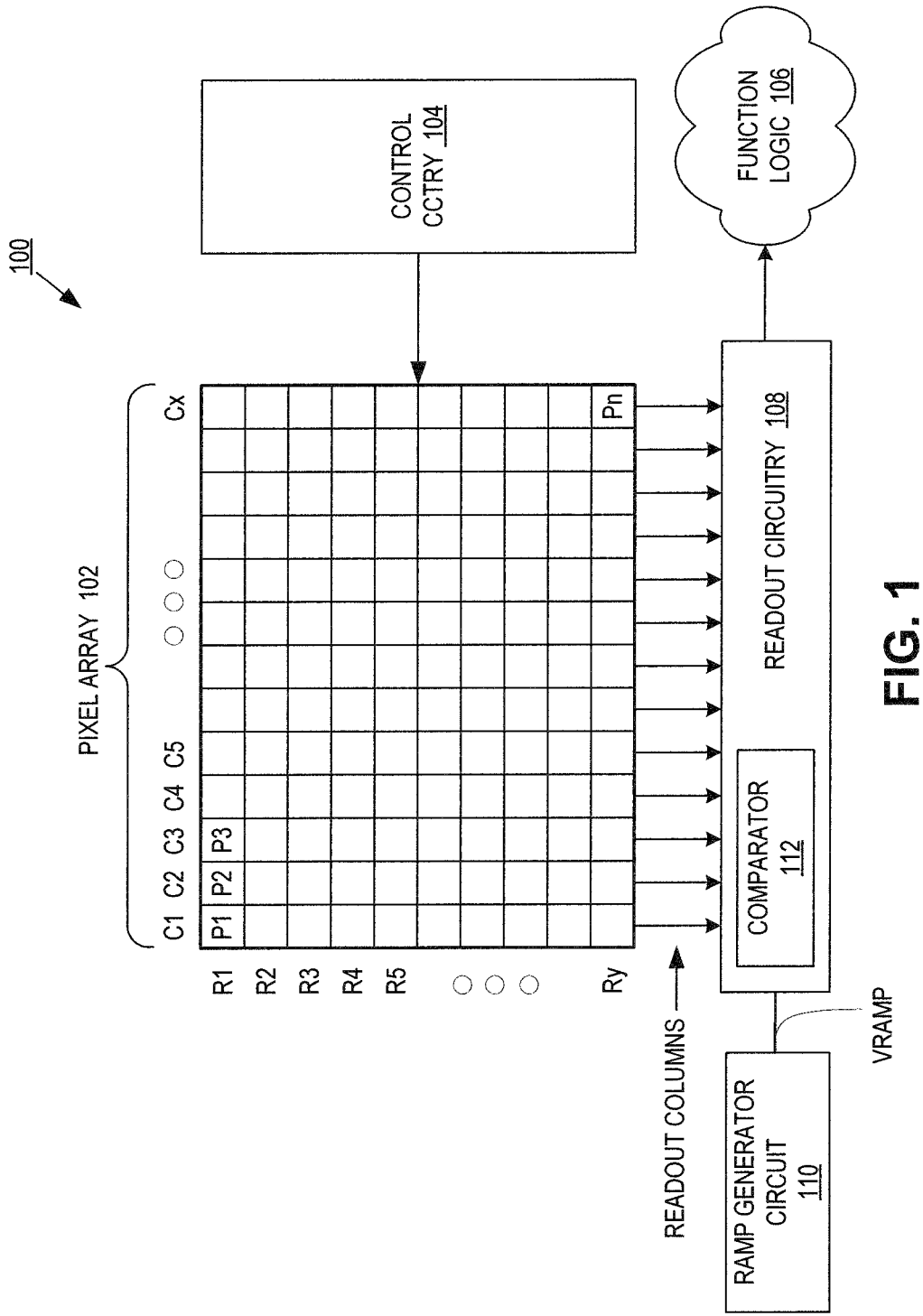
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with increased analog to digital conversion range and reduced noise are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some embodiments, one or more comparators 112 may be included for each of the readout columns. The one or more comparators 112 may be included in a respective analog-to-digital converter (ADC) included in the readout circuitry 108, for example. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage VRAMP from a ramp generator circuit 110. VRAMP may be received by the comparator 112, which may also receive image charge from a pixel of the pixel array 102. The comparator 112 may determine a digital representation of the image charge based on a comparison of VRAMP to the image charge voltage level. The signal VRAMP may be at various voltage levels depending on the timing of the ADC operation, and may be used to auto-zero, e.g., normalize, the inputs of the comparator 112 before image charge is received, e.g., read, by the readout circuitry 108. In some embodiments, VRAMP may be increased when the inputs are auto-zeroed, which may provide an increase to the voltage range used during signal comparison, for example. In some embodiments, VRAMP may be decreased when the inputs are zeroed, which may ensure that the inputs devices operate in a saturation region. The inputs may be NMOS transistors, for example. Although ramp generator 110 is shown as a separate block of the imaging system 100, ramp generator 110 may be included in other blocks, such as the column readout circuit 108, or a voltage generator block (not shown).

In some embodiments, the comparator 112 may include cascode devices in the first stage, which may be selectively enabled in response to an analog gain of the ADC that includes the comparator 112. For example, the cascode devices may be bypassed when the analog gain is low, and enabled when the analog gain is high. The cascode devices and how the auto-zero switch of the bitline input is coupled may affect the biasing of the comparator 112. Furthermore, the comparator 112 may be a two-stage comparator having an adjusted biasing scheme. The adjusted biasing scheme may result with an adjustment of the auto-zero voltage and a change to the "flipping point" of the second stage, for example. The adjustment in the auto-zero voltage, or more precisely how the auto-zero switches are coupled, may guarantee that the cascode devices and input devices are in saturation region at the "flipping point," which may reduce an amount of kickback experienced by the comparator 112, and which may reduce noise. Kickback may generate noise, which may propagate onto the VRAMP and bitline inputs of the comparator. The "flipping point," which may also be referred to as a set point, may be the reference voltage level the output of the comparator 112 changes from a "0" to a "1", for example.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like.

Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 2A:
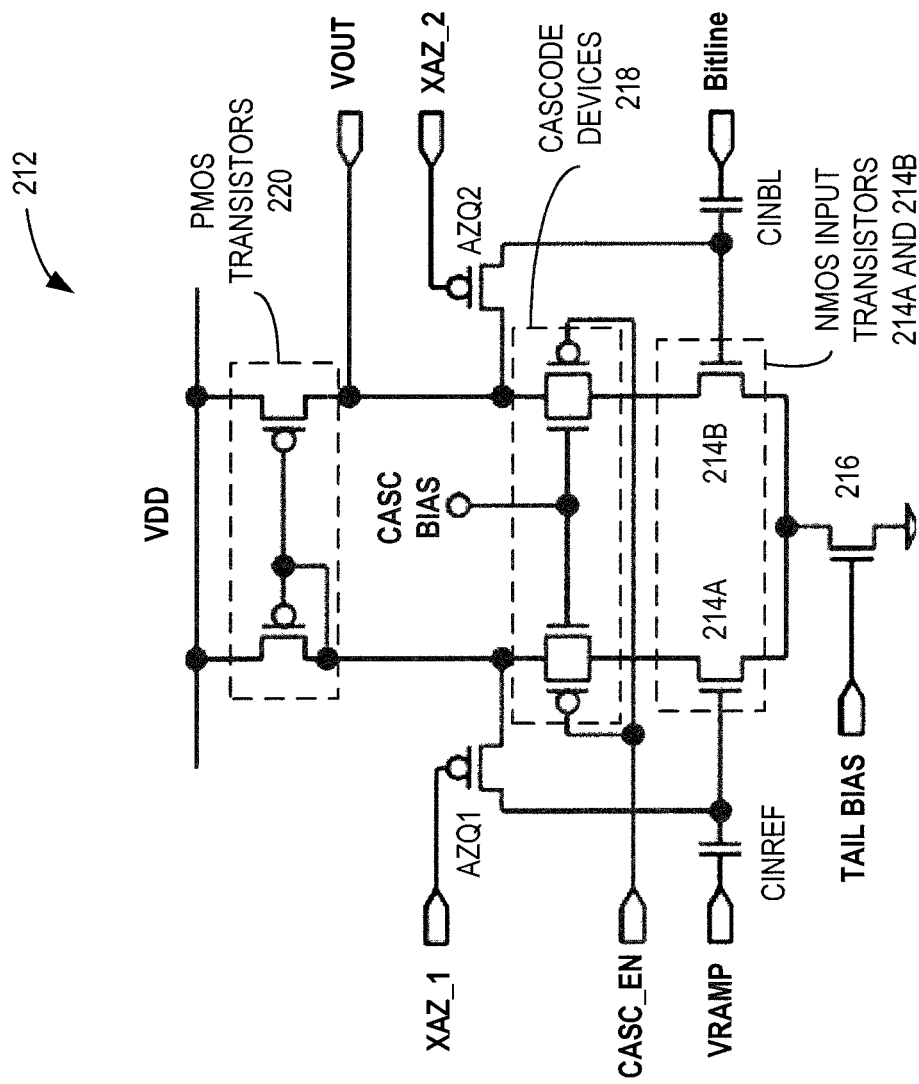
FIG. 2A is a comparator in accordance with an embodiment of the present disclosure.

FIG. 2A is a comparator 212 in accordance with an embodiment of the present disclosure. The comparator 212 may be an example of the comparator 112. The comparator 212 may provide an output signal in response to a comparison of an image charge signal received on the bitline input to a reference voltage signal VRAMP received on the VRAMP input. The output signal may provide a digital representation of the received image charge signal, for example. In some embodiments, the comparator 212 may be included in an analog-to-digital converter (ADC).

The illustrated embodiment of the comparator 212 includes an NMOS tail transistor 216 coupled between a reference voltage, ground in some examples, and two NMOS input transistors 214A and 214B. The two NMOS input transistors 214A, B may be coupled in parallel between the NMOS tail transistor 216 and two respective cascode devices 218. The cascode devices 218 may be coupled between the NMOS input transistors 214A, B and two PMOS transistors 220. The two PMOS transistors 220 may be coupled in parallel between the cascode devices 218 and a reference voltage, VDD for example. The two PMOS transistors 220 may further be coupled together by their gates to form a current mirror. Additionally, the comparator 212 may include two auto-zero switches, AZQ1 and AZQ2, coupled between gates of respective ones of the two NMOS input transistors 214A, B and a node between the cascode devices 218 and the PMOS transistors 220. In some embodiments, two noise filtering capacitors, CINREF and CINBL, may be included to capacitively couple their respective inputs to the gates of the two NMOS input transistors 214A, B.

The comparator 212 may be described as having a reference voltage input side and a bitline, e.g., image data, input side. The reference voltage input side may receive a reference voltage VRAMP, and the bitline input side may receive an image charge voltage signal. The reference voltage input side may include the NMOS input transistor 214A, auto-zero switch AZQ1, one of the cascode devices 218, and one of the PMOS transistors 220. The gate of the PMOS transistor of the reference voltage input side may be coupled to a drain of the same transistor, which may result in the gate of both PMOS transistors coupled to the drain. The image charge input side may include the NMOS transistor 214B, auto-zero switch AZQ2, one of the cascode devices 218, and one of the PMOS transistors 220.

The NMOS tail transistor may be coupled to receive a TAIL BIAS signal at a gate to supply a constant current to the NMOS input transistors 214A, B.

The cascode devices 218 may include two PMOS and two NMOS transistors, with a PMOS and an NMOS transistor coupled like a pass gate, for example. The NMOS transistors may be coupled to a bias voltage CASC BIAS on their gate terminals. The PMOS transistors may be coupled to receive a control signal CASC_EN on their gate terminals. By selectively enabling/disabling the PMOS transistors of the cascode devices 218, the voltage drop across the cascode devices 218 may be modulated. For example, when the cascode devices 218 are enabled, the PMOS transistors may be in an "off" state, thereby forcing all current flow through the NMOS transistors and causing a larger voltage drop across the cascode devices 218. Since the NMOS transistors are in saturation region, the source voltage of the cascode devices is CASC_BIAS−Vgs of the NMOS transistor, and not dependent on a VOUT voltage, e.g., the output of the comparator 212, which allows the cascode devices 218 to reduce kickback from VOUT to "VINBL" and "VIN-RAMP". Conversely, when the cascode devices 218 are disabled, e.g., bypassed, the PMOS transistors may be in an "on" state, thereby providing an additional path for current flow, which may result in lower or no voltage drop across the cascode devices 218 so that the cascode devices do not affect or have a reduced effect on the operation of the comparator 212.

The cascode devices 218 may be coupled to receive the control signal CASC_EN, which may be used to enable/disable the cascode devices 218. The enablement/disablement of the cascode devices 218 may be performed in response to an analog gain or voltage range of ADC. For example, if the analog gain of ADC is low and larger voltage range is required, then the cascode devices 218 may be bypassed, e.g., disabled. Conversely, if the analog gain of the comparator 212 is high and the required voltage range is small, then the cascode devices 218 may be enabled. Enablement/disablement of the cascode devices 218 may affect the voltage on the drain of the NMOS input transistors 214A, B. Affecting the voltage on the drain of the NMOS input transistors 214A, B may affect their source-drain voltage Vds, which may affect their region of operation. Further, if at high gain the cascode devices 218 are not enabled, then a kickback from VOUT to the gates of the NMOS input transistors 214A, B may generate noise in the comparator 212.

In operation, the comparator 212 may compare a voltage level of an image charge signal on the bitline input to a voltage level of the VRAMP reference signal during an ADC operation. The voltage range of the VRAMP signal during ADC, e.g., between t5 and t6 of FIG. 2B, may be used to determine the image charge level, for example. However, prior to ADC, the inputs to the comparator, e.g., VRAMP and bitline, may be normalized, e.g., auto-zeroed, to a base voltage level, which may be referred to herein as the auto-zero voltage level. Control signals XAZ_1 and XAZ_2 provided to the gates of AZQ1 and AZQ2, respectively, may couple/decouple the gates of the NMOS input transistors 214A, B from the nodes between their respective cascode devices 218 and the PMOS transistors 220 before an ADC operation is performed. Normalizing the voltages on the gates of the NMOS input transistors 214A, B may force the inputs to the same voltage level so to remove any error or noise from the ADC operation.

In some embodiments, increasing the auto-zero voltage level may allow the comparator 212 to determine larger image charge voltage signal values, which may result in the voltage range of the ADC being increased. One technique to increase the auto-zero voltage level may be to increase the voltage of VRAMP during an auto-zero operation of the comparator 212. For example, a voltage level of VRAMP may be increased while the comparator 212 is normalized, such as after AZQ1 is disabled but before AZQ2 is disabled. An example of which is provided in FIG. 2B. Increasing the auto-zero voltage may result in an increase in the voltage range of the comparator 212 because the voltage difference between the auto-zero voltage level and a minimum input voltage level may be increased, which may result in the increase in the voltage range of the comparator 212. The auto-zero voltage may be increased when, for example, the analog gain of the comparator 212 is low and the cascode devices 218 are disabled.

In some embodiments, decreasing VRAMP during normalization may increase Vds of the NMOS input transistors 214A, B, which may ensure that they operate in a saturation region. The auto-zero voltage may be decreased after AZQ1 is disabled but before AZQ2 is disabled. The auto-zero voltage may be decreased when, for example, the analog gain of the comparator 212 is high and the cascode devices are enabled. In some embodiments, the voltage amount VRAMP is increased/decreased during the auto-zero operation may be proportional to "VDD−CASC BIAS+Vgs_casc−Vgsp−Vthn+Vmargin," where CASC BIAS is the gate voltage of the NMOS cascode devices, Vgs_casc is the Vgs of the NMOS cascode devices, Vgsp is the Vgs of PMOS transistors 220, Vthn is the threshold voltage of the NMOS input devices 214, and Vmargin is some voltage margin for the input devices. An example voltage margin may be about 100 mV.

Figure 2B:
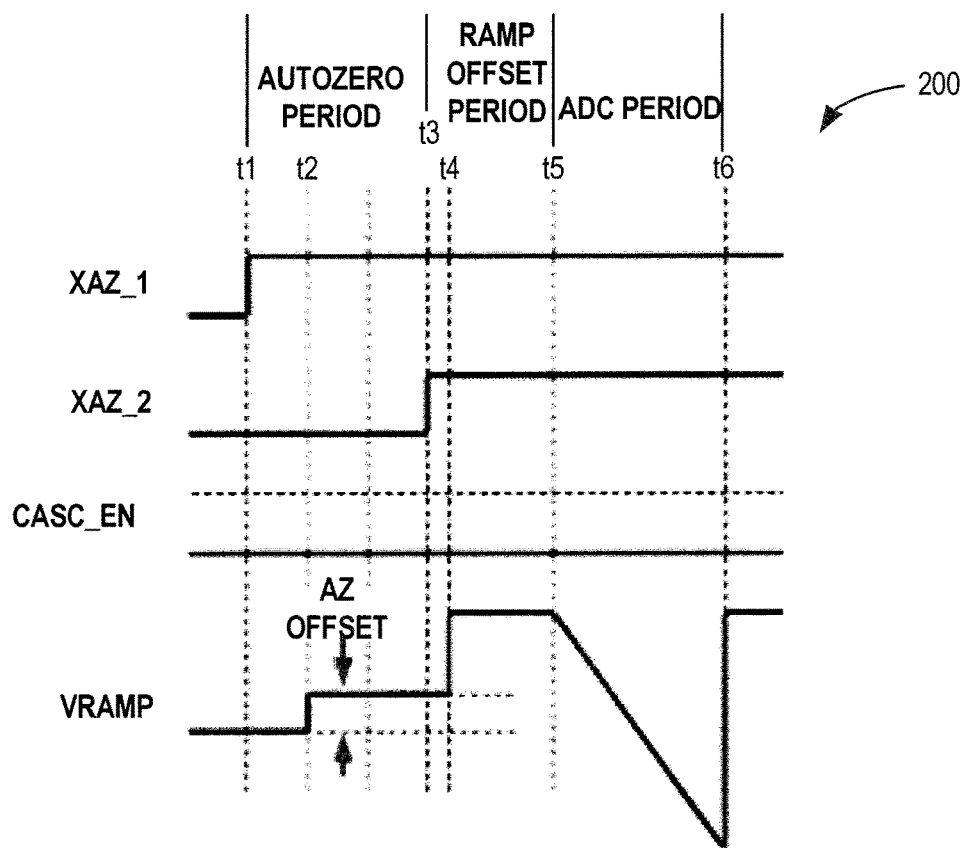
FIG. 2B is an example timing diagram in accordance with an embodiment of the present disclosure.

FIG. 2B is an example timing diagram 200 in accordance with an embodiment of the present disclosure. Timing diagram 200 will be used to illustrate an example operation of the comparator 212 when the analog gain is low. The timing diagram 200 shows three operational periods, such as the Auto-zero period, the Ramp Offset period, and the ADC period. In general, a ramp generator, such as the ramp generator 110 may increase an auto-zero voltage of an ADC comparator, such as the comparator 212, during the Auto-zero period.

Prior to time t1, control signals XAZ_1 and XAZ_2, which control auto-zero switches AZQ1 and AZQ2, may be at a low level thereby enabling AZQ1 and AZQ2. As a result, gates of the NMOS input transistors 214A, B may be coupled to an auto-zero voltage (as discussed above). At time t1, the Auto-zero period begins, which includes control signal XAZ_1 transitioning to a high logic level. The transition to high of the XAZ_1 signal may disable AZQ1. As a result, the gate of the NMOS input transistor 214A may be decoupled from the node between a respective one of the cascode devices 218 and a respective one of the PMOS transistors 220. Further, the gate of the NMOS input transistor 214A may now be coupled to receive VRAMP.

At time t2, the voltage level of VRAMP may be increased by an amount proportional to the threshold voltage Vth of the NMOS input transistors 214A, B. The amount of the increase to VRAMP may be referred to herein as AZ Offset.

At time t3, control signal XAZ_2 may transition high disabling AZQ2. As a result, the bitline input of comparator 212 may now be ready to receive an image charge voltage signal. At time t3, the Auto-zero period ends, and the Ramp Offset period may begin. At time t4, a Ramp Offset voltage may be added to VRAMP. The Ramp Offset voltage may increase VRAMP to an upper operating voltage, for example.

At time t5, which may end the Ramp Offset Period and begin the ADC period, VRAMP may begin to decrease in a negative ramp, for example, until time t6. During the ADC period, the comparator 212 may compare an image charge voltage signal on the bitline input to the VRAMP reference voltage signal to determine a digital representation of the image charge signal. The ADC period, in some embodiments, may be performed multiple times so that noise may be cancelled out of the image charge signal.

The addition of AZ Offset to VREF may occur when the analog gain of ADC is low, for example. It should also be noted that the CASC_EN signal remains low during timing diagram 200, which keeps PMOS transistors of the cascode devices in an "on" state when the output voltage of the comparator VOUT is high. The NMOS transistors of the cascode devices 218 may be in an "on" state due to the CASC BIAS received on their gate terminals when the output voltage of the comparator VOUT is low. So the resistance of the cascode devices 218 are always low and so the cascode devices 218 do not affect to the operation of the comparator.

Figure 2C:
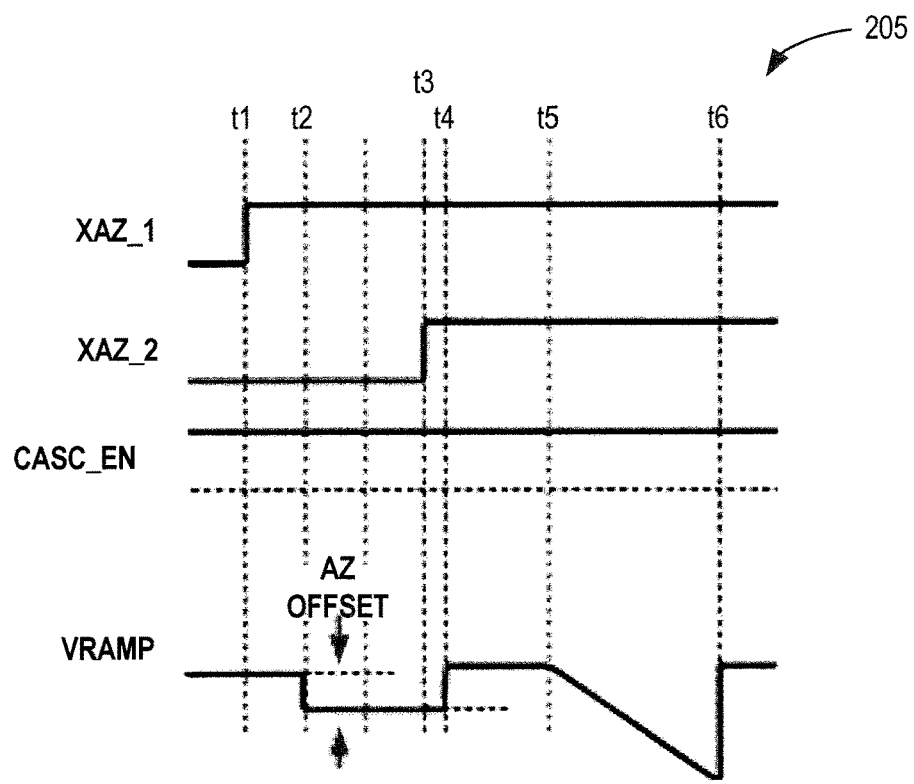
FIG. 2C is an example timing diagram in accordance with an embodiment of the present disclosure.

FIG. 2C is an example timing diagram 205 in accordance with an embodiment of the present disclosure. Timing diagram 205 will be used to illustrate an example operation of the comparator 212 when the analog gain is high. The timing diagram 205 is similar to the timing diagram 200 except for AZ Offset being negative instead of positive, and that the cascode devices 218 being enabled.

At time t2, VRAMP may be decreased by AZ Offset, which may be the voltage proportional to "VDD−CASC BIAS+Vgs_casc−Vgsp−Vthn+Vmargin," where CASC BIAS is the gate voltage of the NMOS cascode devices, Vgs_casc is the Vgs of the NMOS cascode devices, Vgsp is the Vgs of PMOS transistors 220, Vthn is the threshold voltage of the NMOS input devices 214, and Vmargin is some voltage margin for the input devices. An example voltage margin may be about 100 mV. The decrease in VRAMP may increase Vds of the NMOS input devices 214A, B, which may ensure the NMOS input transistors 214A, B are operating in the saturation region at around the "flipping point". Additionally, Vds may be affected by the enablement of the cascode devices 218. For example, since the cascode devices 218 are enabled, the voltage on the drains of the NMOS input transistors 214A, B may be reduced due to the voltage drop across the cascode devices 218.

Figure 3A:
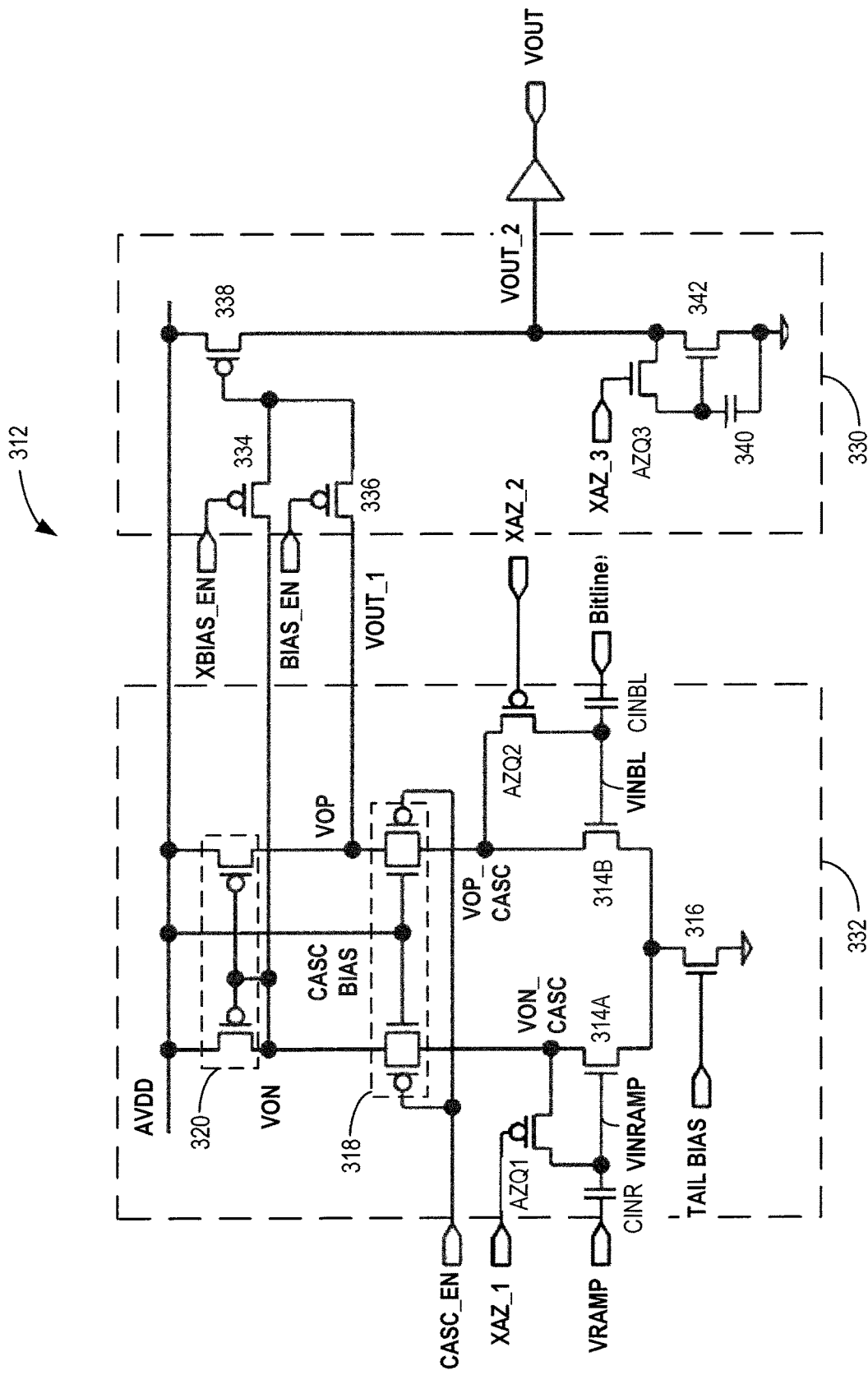
FIG. 3A is an example schematic of a comparator in accordance with an embodiment of the present disclosure.

FIG. 3A is an example schematic of a comparator 312 in accordance with an embodiment of the present disclosure. Comparator 312 may be an example of the comparator 112 and/or 212. The comparator 312 may receive the voltage reference signal VRAMP and an image charge voltage signal on a bitline input and provide a digital representation of the image charge voltage signal on VOUT. In some embodiments, the image charge voltage signal may be compared to VRAMP multiple times, two for example, to cancel any noise in the image charge voltage signal, for example.

The illustrated embodiment of the comparator 312 includes a first stage 332 and a second stage 330. The first stage 332 may be coupled to receive the image charge voltage signal on the bitline input and further coupled to receive VRAMP on the VRAMP input, e.g., the reference voltage input. The first stage 332 may provide a first output VOUT_1 to the second stage 330, which, in response, may provide a second output VOUT_2 to an optional buffer. An output of the optional buffer may provide the output VOUT. The first stage 332 may be biased to flip, e.g., change the level of VOUT_1, based on a comparison between VRAMP and the image charge voltage signal on the bitline input. The second stage 330 may have a set point, e.g., flipping point, based on the voltage VON of the first stage 332. The voltage on VON, which may be based on AVDD and the gate to source voltage of a PMOS transistor 320, may be stored on a capacitor of the second stage 330, which provides the reference voltage for the second stage 330 set point.

The illustrated embodiment of the first stage 332 includes PMOS transistors 320, cascode devices 318, NMOS input transistors 314A and 314B, NMOS tail transistor 316, and auto-zero switches AZQ1 and AZQ2. The PMOS transistors 320 may include two PMOS transistors coupled together at their gates and coupled in parallel between a reference voltage, a high reference voltage denoted as AVDD, and nodes VON and VOP. Further, the PMOS transistors 320 may form a current mirror with the gates coupled to the node VON. The cascode devices 318 may be coupled between the nodes VON and VOP and nodes VON_CASC and VOP_CASC. The NMOS input transistor 314A may be coupled between the node VON_CASC and the NMOS tail transistor 316. The NMOS input transistor 314B may be coupled between the node VOP_CASC and the NMOS tail transistor 316.

The cascode devices 318 include two PMOS and two NMOS transistors with a PMOS and an NMOS transistor coupled like a pass gate, for example. One of the NMOS transistors and one of the PMOS transistors coupled between nodes VON and VON_CASC and the other PMOS transistor and NMOS transistor coupled between VOP and VOP_CASC as shown in FIG. 3A. The gates of the NMOS transistors may be coupled to a bias voltage CASC BIAS, which may keep the NMOS transistors operating in saturation region at around flipping point of the 2nd stage. The gates of the PMOS transistors may be coupled to receive a control signal CASC_EN, which may enable/disable the PMOS transistors of the cascode devices 318. Enabling/disabling the cascode devices 318 may affect the voltage difference between the nodes VON and VON_CASC, and the voltage difference between the nodes VOP and VOP_CASC. Additionally, enablement/disablement of the cascode devices 318 may be based on an analog gain of ADC. For example, if the slope of the VRAMP signal is high so that the gain of the ADC is low, then the cascode devices 318 may be disabled. Conversely, if the slope of the VRAMP signal is low so that the gain of the ADC is high, then the cascode devices 318 may be enabled.

The auto-zero switches AZQ1 and AZQ2 may be coupled between gates of the NMOS input transistors 314A and 314B, respectively, and nodes VON_CASC and VOP_CASC, respectively. The auto-zero switches AZQ1 and AZQ2 may be enabled to couple the gates of their respective NMOS input transistors 314A, B to the respective nodes VON_CASC and VOP_CASC. Enabling the switches auto-zeros, e.g., normalizes, the gate voltage of their respective NMOS input transistors 314 A, B to the voltage on the respective nodes.

The NMOS input transistors 314A, B may be coupled to receive VRAMP and the image charge voltage signal, respectively. The first stage 332 may change a value of VOUT_1 based on a comparison of the image charge voltage signal on the bitline input to VRAMP during an ADC period. VOUT_1 may be provided to the second stage 330.

The illustrated embodiment of the second stage 330 includes an input PMOS transistor 338, a reference input transistor 342, a capacitor 340, and three control switches 334, 336, and AZQ3. While the three control switches 334, 336, and AZQ3 are associated with the second stage 330, the control switches may also be part of the first stage 332, or part of separate control circuitry not specifically associated with either the first or second stages 332, 330, respectively. The control switch 334 may be coupled between a gate of the input transistor 338 and the node VON of the first stage 332. The control switch 336 may be coupled to the gate of the input transistor 338 and the node VOP, which also provides VOUT_1 of the first stage 332. AZQ3 may be coupled to a gate of the reference input transistor 342 to auto-zero the same. In some embodiments, the control switches 334 and 336 may be PMOS transistors having their gates coupled to receive control signals, and the control switch AZQ3 may be an NMOS transistor similarly coupled.

The control switch 334 may be enabled/disabled in response to a control signal XBIAS_EN, and the control switch 336 may be enabled/disabled in response to a control signal BIAS_EN. Control signal XBIAS_EN may enable the switch 334 when the control signal is at a low voltage, for example, which may couple the voltage on the node VON to the gate of the PMOS input transistor 338. Conversely, control signal BIAS_EN may enable the switch 334 when the control signal is at a low voltage, for example, which may couple the voltage on the node VOP to the gate of the PMOS input transistor 338. Generally, control switches 334 and 336 may not be enabled concurrently so as to control the voltage on the gate of the PMOS input transistor 338.

The flipping point, or set point, of the second stage 330 may be based on the voltage on node VON of the first stage 332. (As used herein, referring to a voltage on a node may be stated as simply referring to the node itself.) For example, control signal XBIAS_EN may enable control switch 334 to provide the voltage on node VON to the gate of the PMOS input transistor 338 and the PMOS input transistor 338 outputs the current corresponding to its Vgs, VON−VDD. Additionally, control switch AZQ3 may be enabled, so that the drain and the gate of the NMOS transistor 342 are shorted and the gate of NMOS transistor 342 may be biased to draw the same current as the PMOS input transistor 338 outputs. And the capacitor 340 may be charged to the bias voltage with which the NMOS transistor 342 draws the same current as the PMOS input device 338 when VON is connected to its gate. In this way, the reference input transistor 342 may provide the voltage VON as the reset point of the second stage 330. For example, the second stage 330 may flip when the input, e.g., VOUT_1, falls below VON. If the input voltage to the second stage is higher than VON, the output current of the PMOS input transistor 338 may be smaller than the current drawn by the NMOS transistor 342 so the VOUT_2 becomes low. Conversely, if the input voltage to the second stage is lower than VON, VOUT_2 becomes high because the current drawn by the NMOS transistor may be smaller than the output current from the PMOS input transistor 338.

The input to the second stage, e.g., VOUT_1, may be provided to the gate of the PMOS input transistor 338 in response to the control signal BIAS_EN received by the control switch 336. The control signal BIAS_EN may enable the control switch 336 during a Ramp Offset period, and after both control signals XAZ_1 and XAZ_2 have disabled their respective auto-zero switches AZQ1, 2. The various control signals received by the comparator 312 may be provided by imaging system control circuitry, such as the control circuitry 104.

During the Auto-zero period of operation, e.g., when AZQ2 is enabled and AZQ1 is disabled, the voltage level of VOP_CASC may be proportional to that of VINRAMP because VOP_CASC may be set to make the current on the NMOS input device 314B and the cascode device 318 on the bit line side equal. Further, both switch 334 and 336 may be enabled during Auto-zero period to ensure that the PMOS devices 330, which may be a current mirror, draw almost the same amount of current from VOP and VON. As such, Vgs of the NMOS input device 314A and 314B may be substantially equal. Accordingly, the NMOS input transistor 314B may be in saturation during the Auto-zero period and also during the ADC period, e.g., when the comparator 312 flips. Further, if Vgs of the PMOS transistors 320 are smaller than Vth of the NMOS transistors in the cascode devices 318, the NMOS transistors in the cascode devices 318 may be in the saturation region during ADC period, and so the voltage of VOP_CASC may not be changed depending on VOUT_1. In general, if the drain voltage of the input NMOS transistor 314B is changed, it may propagate to VINBL through the gate-drain capacitance of the NMOS transistor 314B, which may cause the kickback from the VOUT_1 to VINBL to be large. With the cascode devices 318 enabled, since VOP_CASC, which is connected to the drain of the NMOS input transistor 314B, is stable at around the flipping point of the 2nd stage, the amount of the kick may be reduced.

In such an embodiment, during auto-zero of the second stage 330, which may occur when control switch 334 is enabled and control switch 336 is disabled, the input of the second stage 330 may be coupled to VON. Alternatively, both control switch 334 and 336 may be enabled during auto-zero. Even if both control switches 334, 336 are enabled, VON voltage may not be changed since the PMOS current mirror 320 and the cascode devices 318 on the bit line side may have large output resistance. In this way, the current on the reference side and bit line side of the first stage 332 may be substantially equal and, as a result, VINRAMP and VINBL may similarly be substantially equal. This coupling, as noted, may set the flip point of the second stage 330 to VON, e.g., the voltage on node VON. Setting the flip point to VON may force the cascode devices 318 to be in saturation region, or at least close to saturation region, when the comparator 314 makes a decision, e.g., flips, when comparing VRAMP to an input on the bitline. Accordingly, any kickback from VOP to VINBL may be minimal during data conversion, e.g., flipping, because voltage gain from VOP to VOP_CASC may be minimal.

It should be noted that the second stage 330 may also be included in the comparator 212. Including the second stage 330 with the comparator 212 may affect the set point of the comparator 212, for example.

Figure 3B:
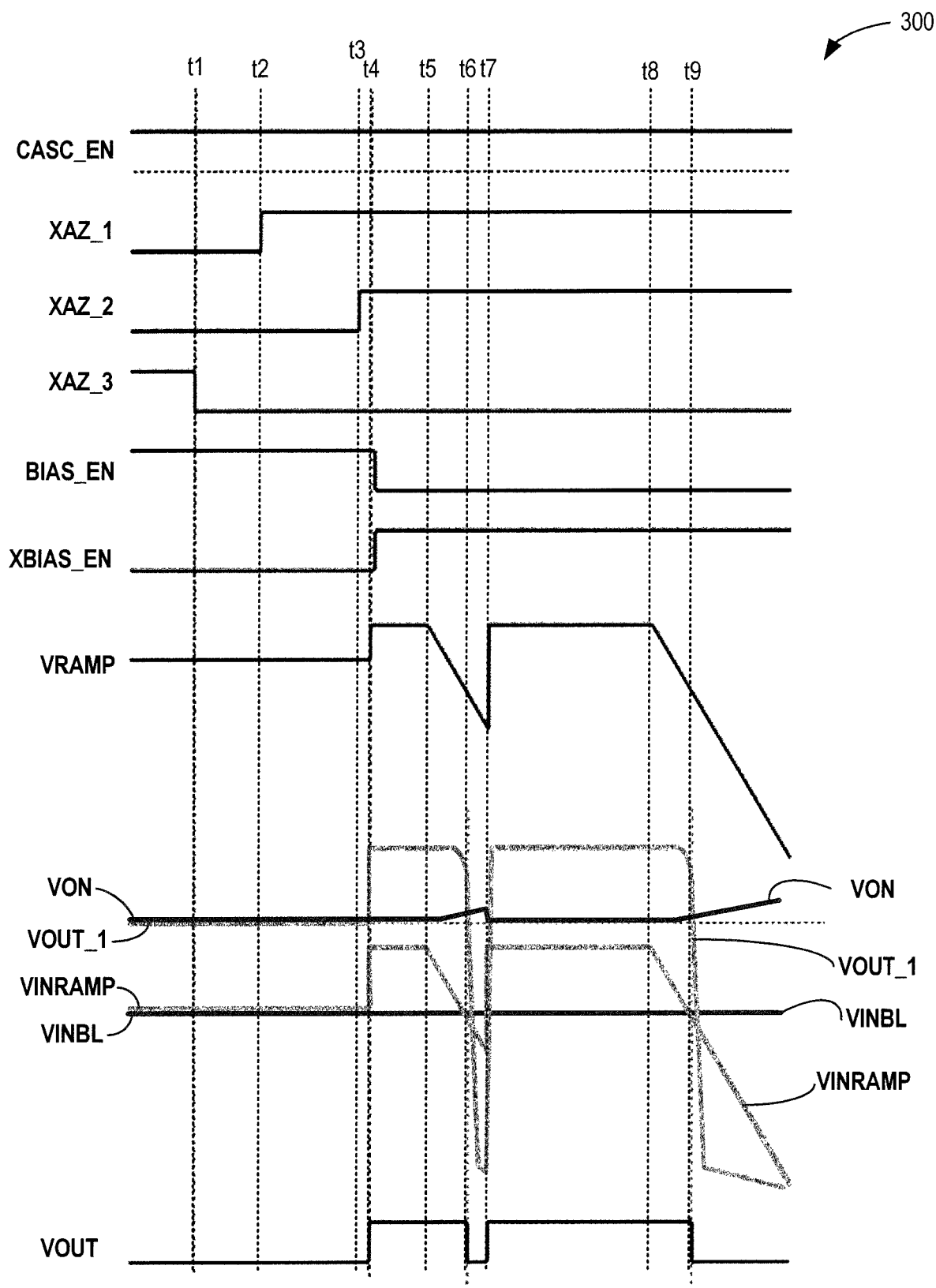
FIG. 3B is an example timing diagram according to an embodiment of the present disclosure.

FIG. 3B is an illustrative timing diagram 300 in accordance with an embodiment of the present disclosure. The timing diagram 300 will be used to illustrate an example operation of the comparator 312. Additionally, the timing diagram 300 may illustrate a comparator 312 when the analog gain is high and the voltage swing of the VRAMP signal is small, which may result in the enablement of the cascode devices 318. Accordingly, the voltages on nodes VON_CASC and VOP_CASC, may be AVDD−Vgs of the NMOS transistors in the cascode devices and lower than the voltages on VON and VOP, respectively.

Prior to time t1, control signal XAZ_3 may be at a high level, which may enable auto-zero switch AZQ3. Enabling AZQ3 may couple the capacitor 340 between a reference voltage, ground for example, and a drain of the NMOS transistor 342. Further, control signal XBIAS_EN may be at a low level, which may enable control switch 334. Accordingly, VON may be coupled to the second stage 330 input, e.g., the gate of the PMOS input transistor 338 and the PMOS transistor 338 output the current to VOUT_2 depending on VON voltage. Additionally, NMOS transistor 342 may draw the same current as 338 from VOUT_2 because the gate and drain are shorted by AZQ3.

At time t1, control signal XAZ_3 may transition low, which may disable AZQ3. As a result, the capacitor 340 may be decoupled from VOUT_2. As such, the bias voltage to the second stage is sampled and held to the capacitance 340, and the second stage may be set to flip when the input voltage to the PMOS 338 is equal to VON.

Prior to time t2, control signals XAZ_1 and XAZ_2 may both be at a low level, which may enable respective auto-zero switches AZQ1, 2. As such, the NMOS input transistors 314A, B may be auto-zeroed. For example, NMOS input transistor 314A may be auto-zeroed by being coupled to VON_CASC, whereas NMOS input transistor 314B may be auto-zeroed by being coupled to VOP_CASC. At time t2, control signal XAZ_1 may transition high, which may disable AZQ1. After time t2, the NMOS input transistor 314A may be coupled to receive VRAMP.

At time t3, control signal XAZ_2 may transition high, which may disable AZQ2. After time t3, the NMOS input transistor 314B may be coupled to receive a signal on the bitline, e.g., an image charge voltage signal.

At time t4, a Ramp Offset voltage may be applied to VRAMP, which may appear at least on VINRAMP. The addition of the Ramp Offset voltage to VRAMP may be performed to increase VRAMP to a maximum level. VRAMP, which may be provided by a ramp generator 110, for example, may increase VRAMP by the Ramp Offset voltage amount.

Further, at or a little after time t4, control signal XBIAS_EN transitions high to disable control switch 334. As a result, the PMOS input transistor 338 may be decoupled from VON. Prior to time t4, BIAS_EN may be high as shown in FIG. 3B, but may also be low as discussed above during auto-zero. Further, at or a little after time t4, control signal BIAS_EN may transition low, which may enable control switch 336. As such, the input to the second stage, e.g., the PMOS input transistor 338, may be coupled to receive the output of the first stage 332, e.g., VOUT_1. Further, because VINRAMP is higher than VINBL, VOUT may be at a high logic level.

At time t5, a VRAMP may begin a negative ramp to determine where an output of the comparator 314 may flip from a high logic level to a low logic level. At time t6, VOUT_1 may equal VON, the second stage 340 reference voltage, which may cause VOUT to flip low. The time between t5 and t6 may be converted to a digital representation of the image charge signal. Time t7 may be the end of the negative ramp. The ADC operation, e.g., the negative ramp period, may be performed again on the same image charge voltage signal, e.g. time t8 and t9. Performing multiple ADC operations may allow noise to be cancelled out, for example. Or the ADC operation may be performed for dark signal without readout from a pixel, e.g., photodiode, and for the image charge voltage signal separately and subtract them to remove the offset of the ADC or the comparator 312.

Figure 4A:
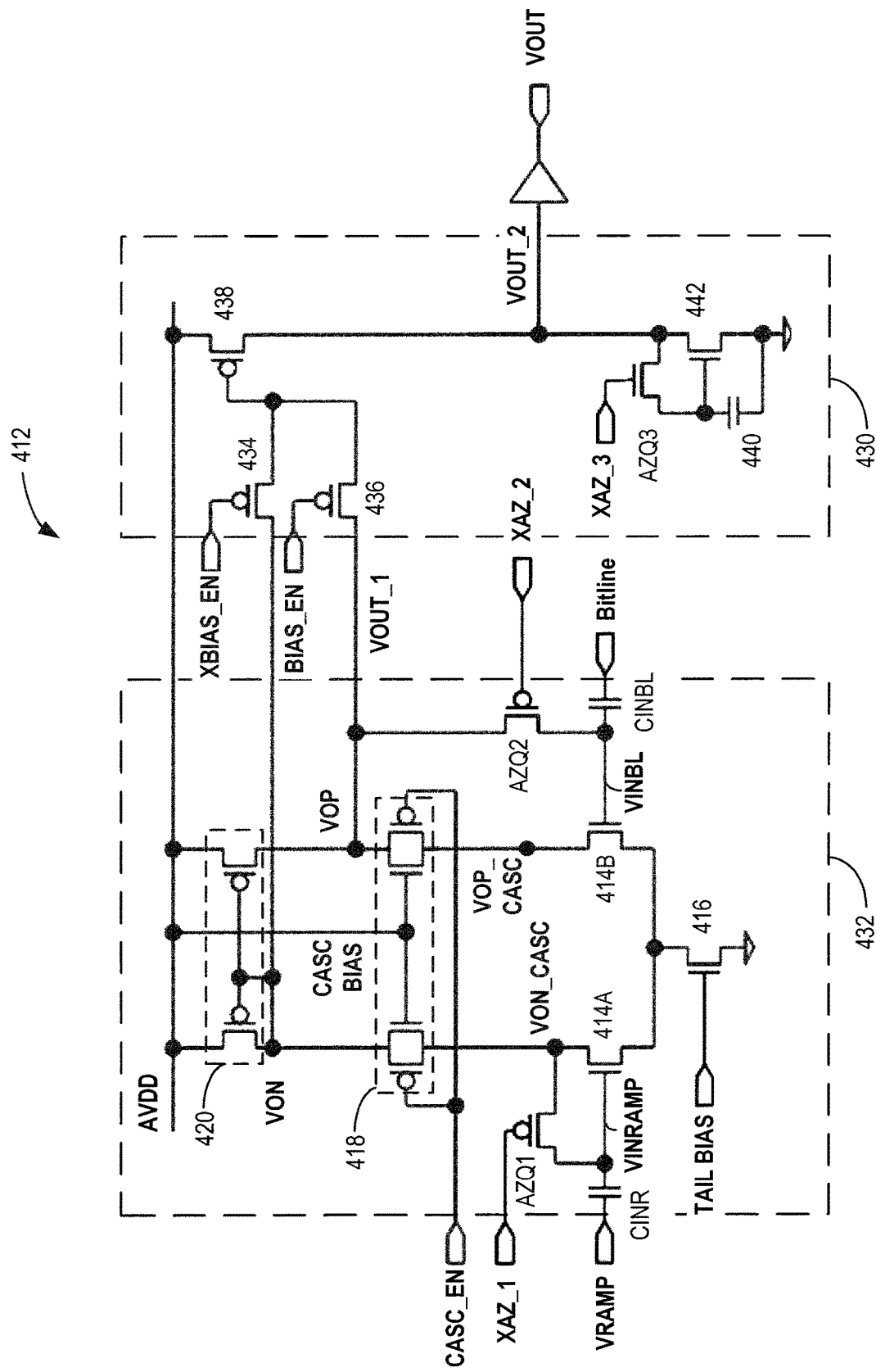
FIG. 4A is a schematic of a comparator in accordance with an embodiment of the present disclosure.

FIG. 4A is a schematic of a comparator 412 in accordance with an embodiment of the present disclosure. The comparator 412 may be an example of the comparator 112, 212, and/or 312. The comparator 412 may be similar to the comparator 312 except for a difference in how the auto-zero switches are coupled. As a result, only the differences between the two comparators 312 and 412 will be discussed for sake of brevity. For the comparator 412, the auto-zero switch AZQ2 may be coupled to node VOP instead of node VOP_CASC, whereas the auto-zero switch AZQ1 may be coupled to VON_CASC. This change, for example, may increase the adjustable voltage range of auto-zero and so AZ OFFSET can be applied like the comparator 112, for example to increase the voltage range.

The cascode devices 418 may be enabled/disabled in response to an analog gain of the ADC. For example, the cascode devices 418 may be enabled when the analog gain is high, and disabled when the analog gain is low. The enabling/disabling of the cascode devices 418 may affect the voltage difference between nodes VON and VON_CASC, and nodes VOP and VOP_CASC. For example, when the cascode devices 418 are enabled due to the analog gain of ADC is high and so the required voltage range is small, then VON_CASC and VOP_CASC may be less than the voltages on respective nodes VON and VOP. As such, both the gate and drain of the NMOS input transistor 414A may be coupled to VON_CASC, which may cause the NMOS input transistor 414A to be in saturation when the auto-zero switch AZQ1 is enabled.

At low gain, however, the cascode devices 418 may be disabled so that VON_CASC equals VON. Accordingly, both the gate and the drain of the NMOS input transistor 414A may be coupled to VON when AZQ1 is enabled. As such, the VINRAMP voltage may be higher than in the high gain example, which may increase the voltage range of the comparator 414.

The auto-zero switch AZQ2 may be coupled to VOP, and, as a result, VOP may be almost same voltage as VINBL, which may be almost same to VINRAMP when AZQ2 is enabled, e.g., during an Auto-zero Period, due to negative feedback from VOP to VINBL. As such, the NMOS input transistor 414B may be in saturation during the Auto-zero period and also during the ADC period, e.g., when the comparator flips. Additionally, if Vgs of the PMOS transistors 420 are smaller than Vth of the NMOS transistors in the cascode devices 418, the NMOS transistors in the cascode devices 418 may be in the saturation region during ADC period and so the voltage of VOP_CASC are not changed depending on VOUT_1. In general, if the drain voltage of the input NMOS 414B are changed, it may propagate to VINBL through the gate drain capacitance of the NMOS transistor 414B and so the kickback from the VOUT_1 to VINBL may be large. With the cascode devices 418 enabled, since VOP_CASC, which is connected to the drain of the NMOS input transistor 414B, is stable at around the flipping point of the 2nd stage, the amount of the kickback may be reduced.

During auto-zero of the second stage 430, which may occur when control switch 434 is enabled and control switch 436 is disabled, the input of the second stage 430 is coupled to VON. This coupling, as noted above, sets the flip point of the second stage 430 to VON, e.g., the voltage on node VON. Setting the flip point to VON may force the cascode devices 418 to be in saturation region, or at least close to saturation region, when the comparator 414 makes a decision, e.g., flips, when comparing VRAMP to an input on the bitline. Accordingly, any kickback from VOP to VINBL may be minimal during data conversion, e.g., flipping, because voltage gain from VOP to VOP_CASC may be minimal.

Figure 4B:
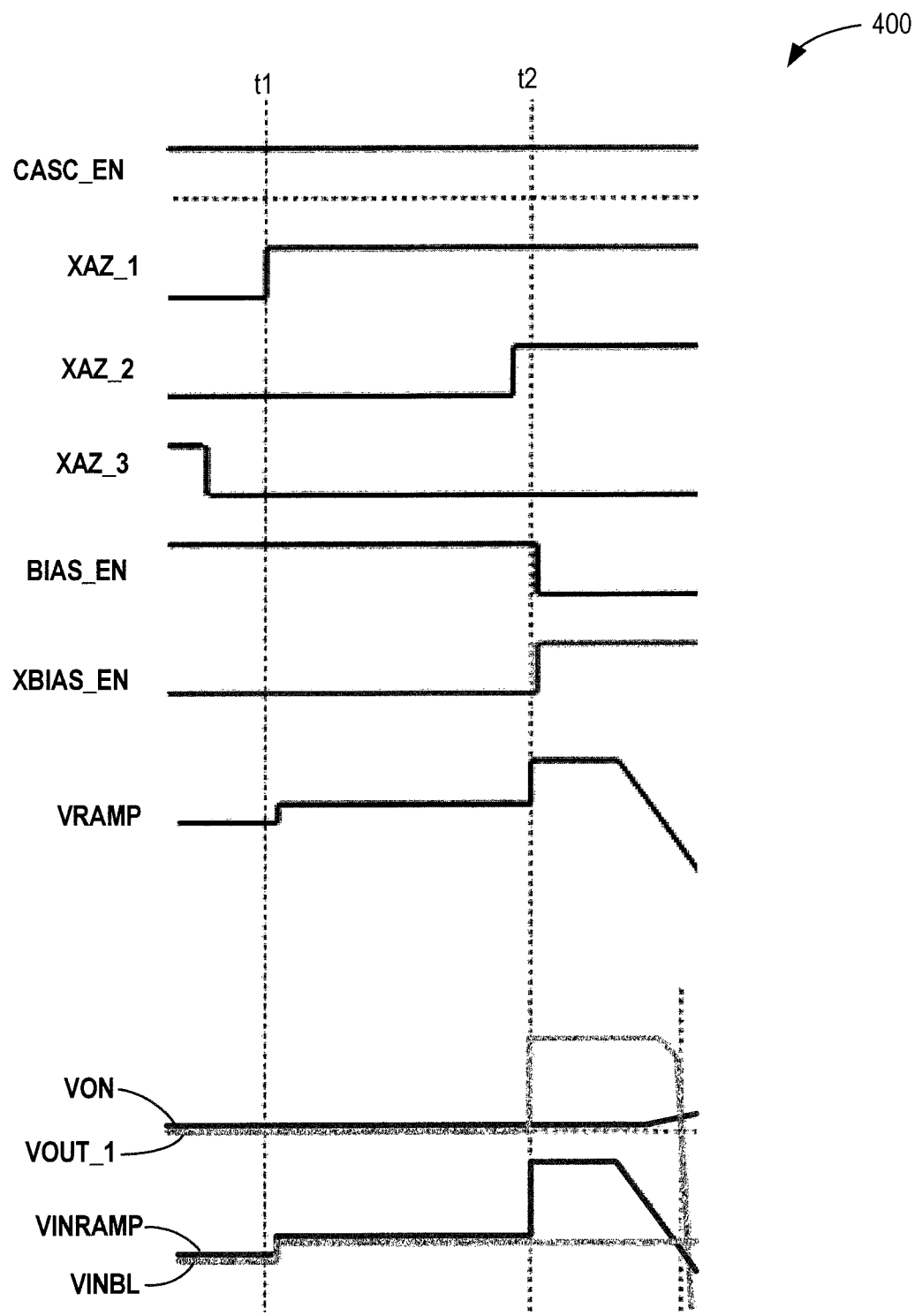
FIG. 4B is an illustrative timing diagram in accordance with an embodiment of the present disclosure.

FIG. 4B is an example timing diagram 400 according to an embodiment of the present disclosure. The timing diagram 400 will be used to illustrate an example operation of the comparator 412. It should be noted, however, that the comparator 412 may also operate in accordance with the timing diagram 300, and the operation in view of the timing diagram 400 is non-limiting. The timing diagram 400 illustrates the change in the control signals received by the comparator 412, and various changes on inputs and outputs during a portion of an operation of the comparator 412. In general, the timing diagram 400 illustrates an increase in VRAMP during the auto-zero operation of the inputs of the first stage 432, which may lead to increase an operating range of the comparator 412.

Due to the analog gain of ADC being high and the voltage swing of the VRAMP being small, the cascode devices 418 may be enabled by having the control signal CASC_EN at a high level. Enabling the cascode devices 418 may provide a voltage drop across the cascode devices 418, which may result in the voltages on nodes VON_CASC and VOP_CASC being lower than respective nodes VON and VOP. Because the NMOS transistors in the cascode devices 418 are in saturation region at around the flipping point of the second stage, the voltage of VOP_CASC may no longer depend on the voltage on VOP, the kickback from VOUT_1 to VINBL and also to VINRAMP may be reduced.

Prior to time t1, control signal XAZ_3 may be high resulting in the enablement of auto-zero switch AZQ3. Additionally, control signal XBIAS_EN may be low resulting in the enablement of control switch 434. Accordingly, the voltage VON may be coupled through to the PMOS input transistor 438 so to charge the capacitor 440 to the bias voltage to set the second stage flipping voltage as the voltage VON. It should be noted that VON prior to time t1 may be a constant voltage level, which may be based on AVDD minus Vgs of one of the PMOS transistors 420. This constant voltage may be used to generate the bias voltage to set the flipping point of the second stage and the bias voltage may be stored on the capacitor 440 to provide a constant, non-time varying, reference voltage for the second stage 430.

Additionally prior to time t1, auto-zero switches AZQ1 and AZQ2 are enabled so the input nodes VINRAMP and VINBL are normalized, e.g., auto-zeroed, to a base voltage. For example, the base voltage may be the voltages on nodes VON_CASC and VOP, respectively. At time t1, control signal XAZ_1 transitions high, which disables auto-zero switch AZQ1. Just after time t1, but before time t2, VRAMP is increased by an AZ Offset voltage amount, which appears on the VINRAMP input. In some embodiments, the AZ Offset voltage may be less than Vth of the NMOS input transistors 414A, B. The AZ Offset voltage may be generated by a ramp generator, such as the ramp generator 110, which may also provide VRAMP. Due to the negative feedback from VOP to VINBL, the voltage of VINBL and VINRAMP may be almost same so the AZ Offset voltage may also be added to both of the voltage VINRAMP and VINBL and auto-zero voltage may be increased. The increase to the auto-zero voltage may increase the voltage range of the comparator 412, for example.

At time t2, control signal XAZ_2 may transition high, which disables auto-zero switch AZQ2. As a result, the bitline side input may be in a state to receive an image charge voltage signal from a bitline, for example. Additionally at time t2, control signal XBIAS_EN transitions high to disable control switch 434. As a result, voltage VON may be decoupled from the PMOS input transistor 438. Concurrently, control signal BIAS_EN may transition low to enable control switch 436. As a result, the output of the first stage 432, VOUT_1, may be coupled to the PMOS input transistor 438.

Further at time t2, a Ramp Offset voltage may be applied to VRAMP, which may increase VRAMP to a maximum voltage level. From the maximum voltage level, VRAMP may decrease linearly during an ADC operation. The increase to VRAMP, which may be provided by a ramp generator, may propagate to VINRAMP. During the negative ramp portion of VRAMP, e.g., the ADC portion, the comparator 412 determines a digital representation of the image charge voltage signal received on the bitline input, and provides the same in response. The ADC operation may be performed again on the same image charge signal. Performing multiple ADC operations may allow noise to be cancelled out, for example. Alternatively or additionally, the ADC operation may be performed for a dark signal without readout from pixel, e.g., photodiode, and for the image charge voltage signal separately and subtract the two readings to remove the offset of the ADC or the comparator 412.

Figure 5:
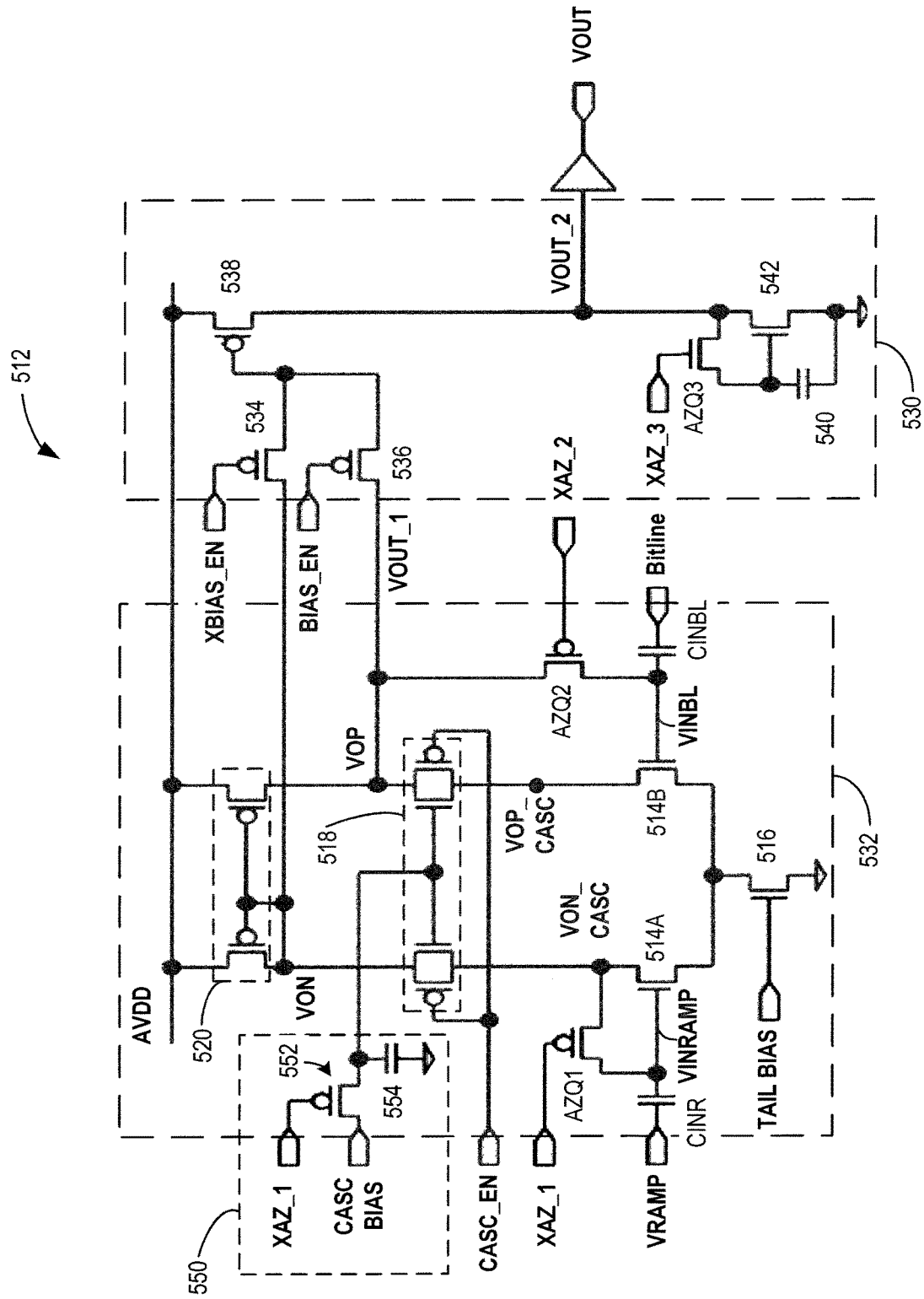
FIG. 5 is an example schematic of comparator in accordance with an embodiment of the present disclosure.

FIG. 5 is an example schematic of comparator 512 in accordance with an embodiment of the present disclosure. The comparator 512 may be an example of the comparators 112, 212, 312, and 412. The comparator 512 may differ from the other comparators discussed herein by inclusion of a local sampling circuit 550. The local sampling circuit 550 may reduce H-banding noise, for example. Further, the comparator 512 may operate in accordance to the timing diagrams 300 and/or 400 to reduce H-banding noise in an image sensor, for example.

The local sampling circuit 550 may provide the CASC BIAS to the cascode devices 518 instead of the cascode devices 518 being coupled to the CASC BIAS. H-banding may occur if the cascode devices are directly coupled to the CASC BIAS. H-banding may be caused by fluctuations on the bias voltage line due to comparators flipping at different times. It should be noted that the readout circuitry 108 may include a comparator for each readout column, e.g., bitline, which may all be coupled to bias voltage. For example, comparators reading darker signals may flip faster than comparators reading brighter signals. When comparators flip, their bias voltage, such as AVDD, may be disturbed due at least in part to coupling the CASC BIAS to VOP and VOP_CASC, and further due to the finite impedance of the bias voltage line. If the CASC BIAS can be sampled and held locally at each comparator, then any disturbance to CASC BIAS may be prevented from propagating on the global bias line during ADC period. Accordingly, the local sampling circuit 550 may provide a local CASC BIAS to the cascode devices 518, which may be decoupled from a global bias line.

The illustrated embodiment of the local sampling circuit 550 includes a control switch 552 and a capacitor 554. The control switch, which may be a PMOS transistor, may be coupled to receive the control signal XAZ_1 at a gate, and further receive the bias voltage CASC BIAS at a source. A drain of the control switch 552 may be coupled to the gates of the NMOS transistors of the cascode devices 518. The capacitor 554, which may be coupled between the gates of the NMOS transistors of the cascode devices 518 and ground, may be charged to CASC BIAS when the control switch 552 is enabled. Further, because the local sampling circuit 550 is enabled/disabled in response to XAZ_1, the capacitor 554 may be coupled during the auto-zero operation, and may be decoupled from a global bias line during an ADC operation, thereby noise from the CASC BIAS don't propagate through the cascode devices and also shielding the global bias line from disturbances caused by the cascode devices 518 when the comparator 512 flips. For example, any disturbances propagate through the cascode devices 518 may be limited to the capacitor 554 and/or the control switch 552.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A comparator, comprising:
a first stage coupled to compare a reference voltage to an image charge voltage signal and provide a first output in response, the first stage including:
first and second NMOS input transistors coupled between an enabling transistor and respective first and second cascode devices, wherein gates of the first and second NMOS input transistors are coupled to receive the reference voltage and the image charge voltage signal, respectively;
a first auto-zero switch coupled between the gate of the first NMOS input transistor and a first node, the first node formed between the first NMOS input transistor and the first cascode device; and
a second auto-zero switch coupled between the gate of the second NMOS input transistor and a second node, the second node formed between a second cascode device and a first PMOS transistor, wherein the second node is an output of the first stage,
wherein a voltage difference between the first and second nodes that the first and second NMOS input transistors are coupled to during an auto-zero period of operation of the comparator reduces an amount of kickback that occurs during an ADC period of operation of the comparator.

2. The comparator of claim 1, further comprising a second stage coupled to receive the first output and provide a second output in response, the second stage including:
a PMOS input transistor coupled to receive the first output at a gate;
a first capacitor coupled to store a second stage reference voltage;
a reference voltage input coupled to the PMOS input transistor at a drain, and further coupled to the first capacitor at a gate; and
a first control switch coupled between the gate of the PMOS input transistor and a third node of the first stage, wherein the third node of the first stage is formed between the first cascode device and a second PMOS transistor, and
wherein the first capacitor is charged to a voltage based on a voltage on the third node of the first stage in response to the first control switch being enabled.

3. The comparator of claim 1, wherein the first and second cascode devices include an NMOS transistor coupled to a PMOS transistor by their sources and drains, and wherein gates of the NMOS transistors are coupled together, and wherein gates of the PMOS transistors are coupled to receive a first control signal.

4. The comparator of claim 3, wherein the gates of the NMOS transistors are coupled to a high reference voltage.

5. The comparator of claim 3, wherein the gates of the NMOS transistors are coupled to a cascode bias voltage through a local sampling circuit, the local sampling circuit controllable to decoupled the gates of the NMOS transistors from the cascode bias voltage during an analog-to-digital operation.

6. The comparator of claim 1, wherein the first and second cascode devices are coupled to be disabled in response to the comparator having low analog gain.

7. The comparator of claim 1, wherein the first and second cascode devices are coupled to be enabled in response to the comparator having high analog gain.

8. An imaging system, comprising:
an array of pixels to receive image light and generate an image charge voltage signal in response;
readout circuitry coupled to receive the image charge voltage signal from the array of pixels and provide a digital representation of the image charge voltage signal in response, the readout circuitry including a comparator to receive the image charge, compare the image charge voltage signal to a reference voltage, and provide the digital representation of the image charge voltage signal in response, wherein the comparator comprises:
a first stage coupled to receive the image charge and the reference voltage and provide a first output in response; and
a second stage coupled to receive the first output and provide the digital representation of the image charge voltage signal in response, the second stage comprising:
an input coupled to receive the first output;
a first capacitor coupled to store a second stage reference voltage;
a reference voltage input coupled to the input, and further coupled to the first capacitor at a gate; and
a first control switch coupled between the input and a first node of the first stage, and
wherein the first capacitor is charged to a voltage based on a voltage on the first node of the first stage in response to the first control switch being enabled.

9. The imaging system of claim 8, wherein the first stage comprises:
first and second NMOS input transistors coupled between an enabling transistor and respective first and second cascode devices, wherein gates of the first and second NMOS input transistors are coupled to receive the reference voltage and the image charge voltage signal, respectively;
a first auto-zero switch coupled between the gate of the first NMOS input transistor and a second node, the second node formed between the first NMOS input transistor and the first cascode device; and
a second auto-zero switch coupled between the gate of the second NMOS input transistor and a third node, the third node formed between a second cascode device and a first PMOS transistor, wherein the third node is an output of the first stage.

10. The imaging system of claim 9, wherein a voltage difference between the second and third nodes that the first and second NMOS input transistors are coupled to during an auto-zero period of operation of the comparator reduces an amount of kickback that occurs during an ADC period of operation of the comparator.

11. The imaging system of claim 8, further comprising a ramp generator coupled to provide the reference voltage.

12. The imaging system of claim 8, wherein the second stage input is a PMOS transistor coupled to receive the first output and coupled to the first node at a gate.

13. The imaging system of claim 12, wherein the second stage further includes first and second control switches coupled to control the coupling of the gate of the PMOS transistor to receive the first output and to the first node, respectively.

* * * * *